United States Patent
Hsiao et al.

(10) Patent No.: US 9,070,667 B2
(45) Date of Patent: Jun. 30, 2015

(54) PERIPHERAL ELECTRICAL CONNECTION OF PACKAGE ON PACKAGE

(71) Applicant: Taiwan Semiconductor Manufacturing Company, Ltd., Hsin-Chu (TW)

(72) Inventors: Ching-Wen Hsiao, Hsin-Chu (TW); Chih-Wei Lin, Xinfeng Township (TW); Wei Sen Chang, Jinsha Township (TW); Yen-Chang Hu, Tai-Chung (TW); Kuo Lung Pan, Hsin-Chu (TW); Yu-Chih Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/778,883

(22) Filed: Feb. 27, 2013

(65) Prior Publication Data
US 2014/0239507 A1    Aug. 28, 2014

(51) Int. Cl.
*H01L 23/48*    (2006.01)
*H01L 21/50*    (2006.01)

(52) U.S. Cl.
CPC ............. *H01L 23/481* (2013.01); *H01L 21/50* (2013.01); *H01L 2224/73204* (2013.01); *H01L 2924/19105* (2013.01); *H01L 2924/13091* (2013.01); *H01L 2924/1305* (2013.01)

(58) Field of Classification Search
CPC ............. H01L 2224/73204; H01L 2924/0002; H01L 23/481; H01L 21/50; H01L 2924/19105
See application file for complete search history.

(56) References Cited

U.S. PATENT DOCUMENTS

| | | | |
|---|---|---|---|
| 2009/0065907 A1* | 3/2009 | Haba et al. | 257/621 |
| 2010/0013081 A1* | 1/2010 | Toh et al. | 257/692 |
| 2010/0308459 A1 | 12/2010 | Bathan et al. | |

FOREIGN PATENT DOCUMENTS

| | | |
|---|---|---|
| JP | 2004342861 | 2/2004 |
| KR | 1020120044447 | 5/2012 |

* cited by examiner

*Primary Examiner* — Whitney T Moore
(74) *Attorney, Agent, or Firm* — Slater & Matsil, L.L.P.

(57) ABSTRACT

Various embodiments of mechanisms for forming a die package using through sidewall vias (TsVs), which are formed by sawing through substrate via (TSV) in half, at edges of dies described enable various semiconductor dies and passive components be electrically connected to achieve targeted electrical performance. Redistribution structures with redistribution layers (RDLs) are used along with the TsVs to enable the electrical connections. Since the TsVs are away from the device regions, the device regions do not suffer from the stress caused by the TSV formation. In addition, electrical connections between upper and lower dies by the TsVs increases the efficiency of the area utilization of the die package.

21 Claims, 10 Drawing Sheets

PERIPHERAL ELECTRICAL CONNECTION OF PACKAGE ON PACKAGE

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package is bonded to a bottom package. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2A-2O show cross-sectional views of a sequential process flow of preparing a die package, in accordance with some embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D ICs) have been therefore created to resolve the above-discussed limitations. In some formation processes of 3D ICs, two or more wafers, each including an integrated circuit, are formed. The wafers are then bonded with the devices aligned. Through-substrate-vias (TSVs), also referred to as through-silicon-vias or through-wafer vias in some embodiments, are increasingly used as a way of implementing 3D ICs. TSVs are often used in 3D ICs and stacked dies to provide electrical connections and/or to assist in heat dissipation. There are challenges in forming TSVs in 3D ICs and stacked dies.

Figure 1:
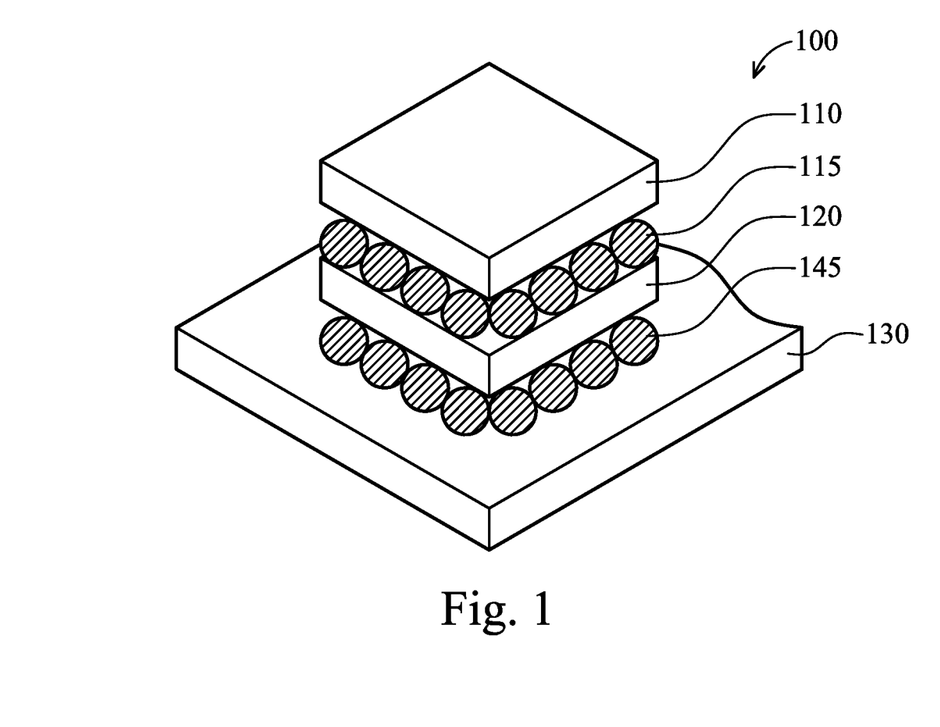
FIG. 1 is a perspective view of a package structure, in accordance with some embodiments.

FIG. 1 is a perspective view of a package structure 100 including a package 110 bonded to another package 120, which is further bonded to another substrate 130 in accordance with some embodiments. Each of die packages 110 and 120 includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices. Package 120 includes through substrate vias (TSVs) and functions as an interposer, in accordance with some embodiments.

Substrate 130 may be made of bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals. In some embodiments, substrate 130 is a multiple-layer circuit board. Package 110 is bonded to package 120 via connectors 115, and package 120 is bonded to substrate 130 via external connectors 145. In some embodiments, the external connectors 145 are bonded bump structures, such as bonded solder bumps, or bonded copper posts with a joining solder layer.

As mentioned above, TSVs are often used in 3D ICs and stacked dies to provide electrical connections and/or to assist in heat dissipation. In some embodiments, package 120 includes TSVs and functions as an interposer. The TSVs in package could be formed in a die(s) in package 120. Alternatively, through package vias (TPAs) or through assembly vias (TAVs) may be formed in package 120 to provide electrical connections and/or to assist in heat dissipation. However, there are device degradation issues with TSVs being formed near the device regions in the die(s) of package 120, in some embodiments. Further, TPAs or TAVs can take up large areas of package 120 in some embodiments. Therefore, there is need for alternative structures and methods of forming the structures to provide electrical connections and/or to assist in heat dissipation for a bottom package, such as package 120, of a package on package structure.

Figure 2A:
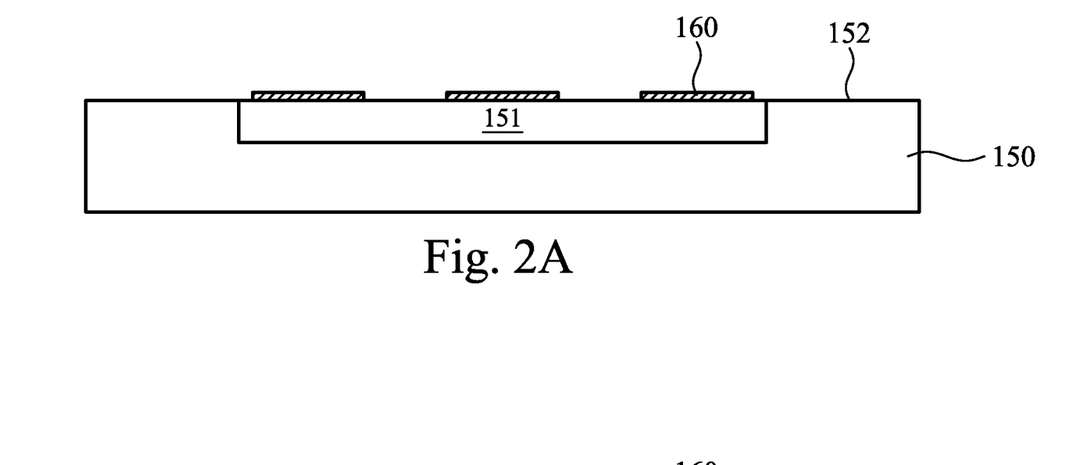

FIGS. 2A-2O show cross-sectional views of a sequential process flow of preparing a package on package structure, in accordance with some embodiments. FIG. 2A shows conductive pads 160 being formed over a surface 152 of a semiconductor substrate 150. The conductive pads 160 may be made of any conductive materials, such as aluminum, aluminum alloy, copper, copper alloy, etc. FIG. 2A shows that semiconductor substrate 150 include a device region 151, which includes transistors and interconnect (not shown). The interconnect electrically connects transistors and is formed over transistors next to surface 152 of substrate 150. The conductive pads 160 contact top conductive structures of interconnect (not shown) in substrate 150.

Figure 2B:
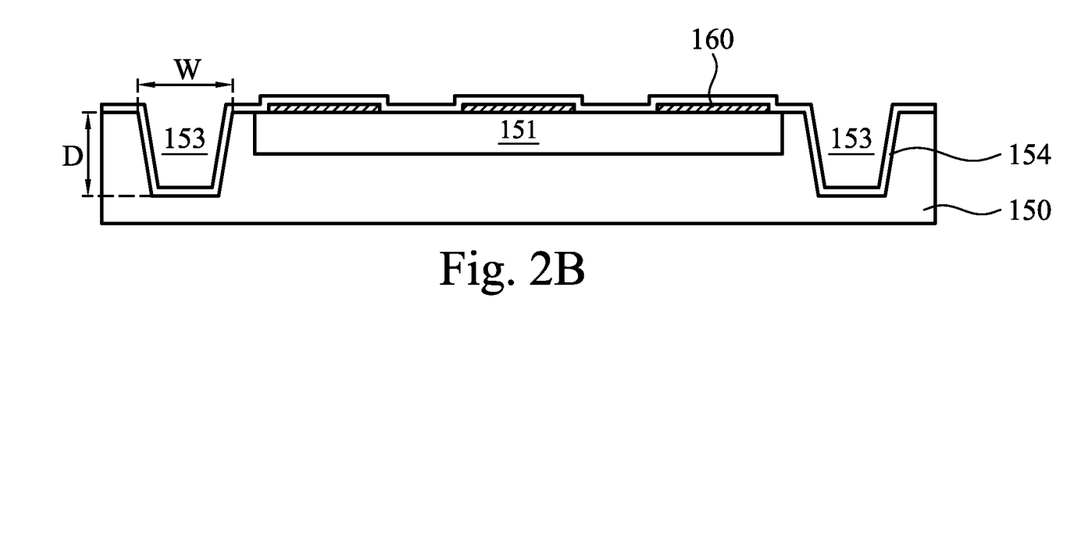
Figure 2C:
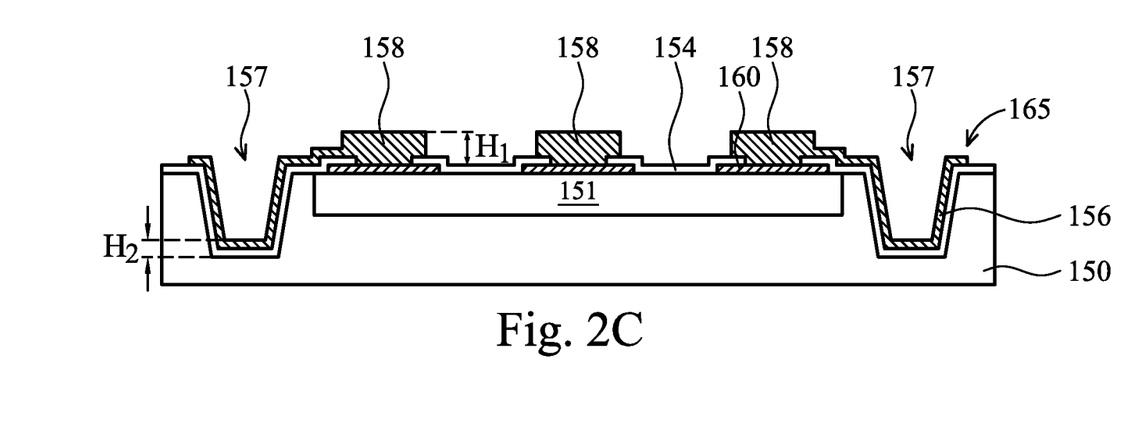

After the conductive pads 160 are formed, openings 153 of through substrate vias (TSVs) 153 are formed outside and surrounding the device region 151, as shown in FIG. 2B in accordance with some embodiments. The width W of openings 153 is in a range from 10 μm to about 200 μm, in some embodiments. The depth D of openings 153 is in a range from about 30 μm to about 250 μm, in some embodiments. After openings 153 are formed, a passivation layer 154 is formed and patterned over the surface of substrate 150, as shown in FIG. 2C, in accordance with some embodiments. As shown in FIG. 2B, passivation layer 154 is patterned to expose areas, such as portions of surfaces of conductive pads 160. The passivation layer 154 is made of a dielectric material and has the functions of providing protection to the surface underneath it and also of absorbing stress incurred during the bonding process. In some embodiments, the passivation layer 154 is made of silicon oxide, or silicon nitride. The thickness of passivation layer 154 is in a range from about 0.01 μm to about 1 μm, in some embodiments.

A barrier-seed layer (not shown) is then formed over the surface of substrate 150, including the surface of passivation layer 154, in preparation of a following copper plating process. The barrier-seed layer includes a copper diffusion barrier layer made of a copper diffusion barrier material, such as Ti, and a copper seed layer. In some embodiments, the copper diffusion barrier layer and the copper seed layer are formed by physical vapor deposition (PVD) processes. The thickness of barrier-seed layer is in a range from about 0.02 μm to about 0.1 μm, in some embodiments.

After the barrier-seed layer is formed, a photoresist layer (not shown) is formed and patterned over substrate 150 to define areas for copper plating. Copper plating is performed afterwards to form a copper layer 156. The copper seed layer described above assist the formation of copper layer 156 during the copper plating process. After the copper layer 156 is formed, the photoresist layer is removed. Following the removal of the photoresist layer, the exposed barrier-seed layer (not covered by copper layer 156) is removed by etching and TSVs 157 are formed. FIG. 2C shows substrate 150 after the exposed barrier-see layer is removed, in accordance with some embodiments. The copper layer 156 over conductive pads 160 form copper posts 158.

FIG. 2C shows that the thickness $H_1$ of copper posts 158 is higher than the thickness $H_2$ of copper layer 156 in TSVs 157. The higher thickness of $H_1$ than $H_2$ is due to larger plating surface in TSVs 157, in comparison to plating surface above conductive pads 160. In some embodiments, $H_2$ is in a range from about 0.35 μm to about 40 μm. In some embodiments, $H_1$ is in a range from about 10 μm to about 40 μm.

Figure 2D:
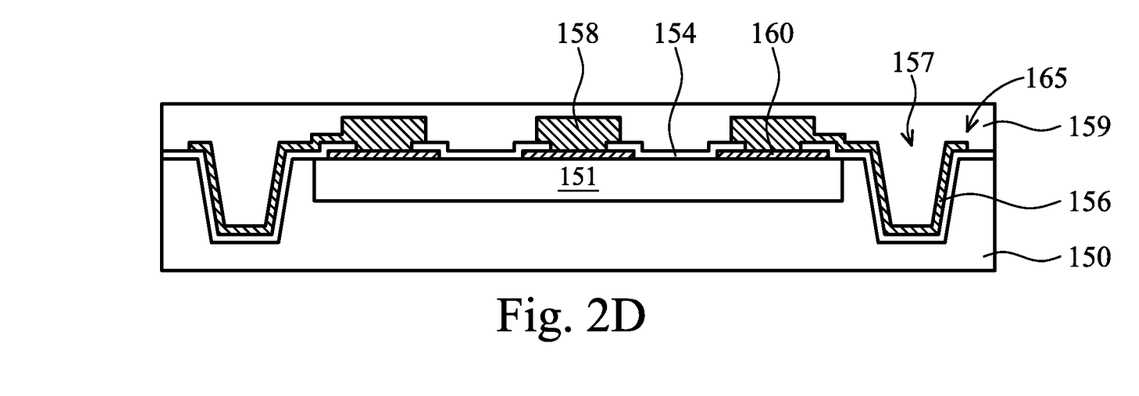
Figure 2E:
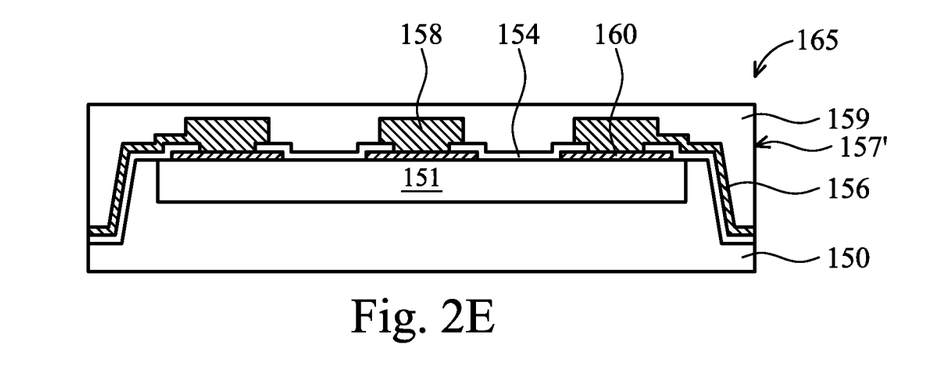

A non-conductive film (NCF) 159 is then laminated over substrate 150 to cover the copper posts 158 and the remaining surface of substrate 150, as shown in FIG. 2D in accordance with some embodiments. The NCF 159 is made of an adhesive material, such as epoxy, in accordance with some embodiments. After NCF 159 is formed, substrate 150 is attached to a grinding apparatus via NCF 159, in accordance with some embodiments. The backside of substrate, i.e. the side opposite from the side with device region 151, is thinned by the grinding apparatus. Afterwards, substrate 150 undergoes singulation, such as by sawing, to separate into individual dies. Each individual die includes a device region 151. The sawing blade cuts through the TSVs 157. FIG. 2E shows an individual die 165 after the singulation operation, in accordance with some embodiments. After singulation, each TSV 157 is divided into half and the half-TSVs 157' are located at the sidewalls of the individual die 165. The half-TSVs 157' may also be called as through sidewall via (TsV) 157'.

Figure 2F:
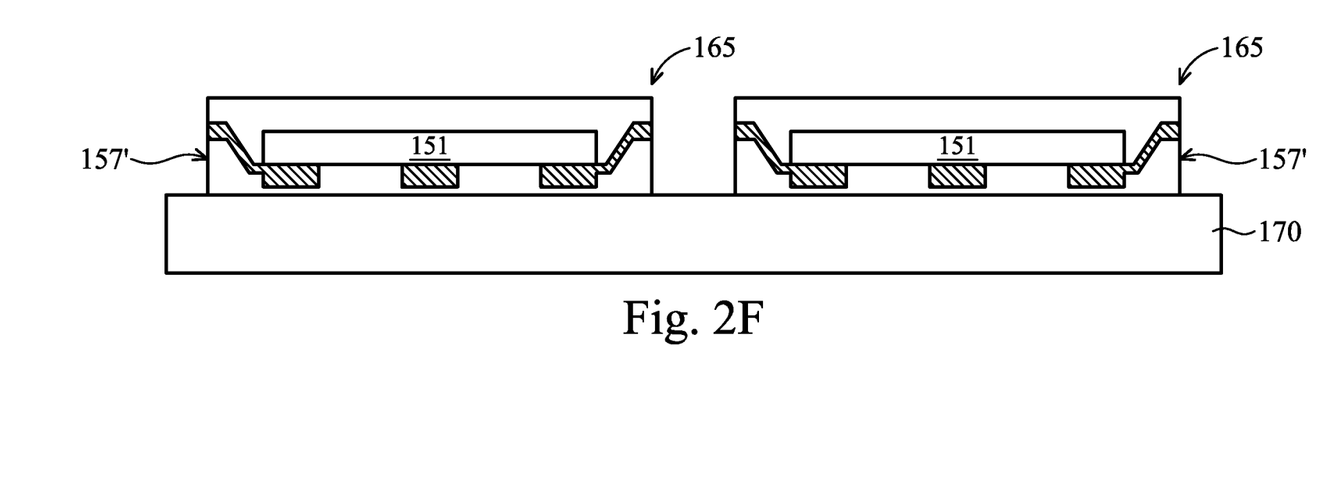

Following the singulation operation, dies 165 are attached to a carrier 170 via NCF 159, as shown in FIG. 2F in accordance with some embodiments. Carrier 170 may be made of various materials that can provide support for dies 165 and the packaging processes following. In some embodiments, carrier 170 is made of glass. However, other materials, such as stainless steel, may also be used.

Figure 2G:
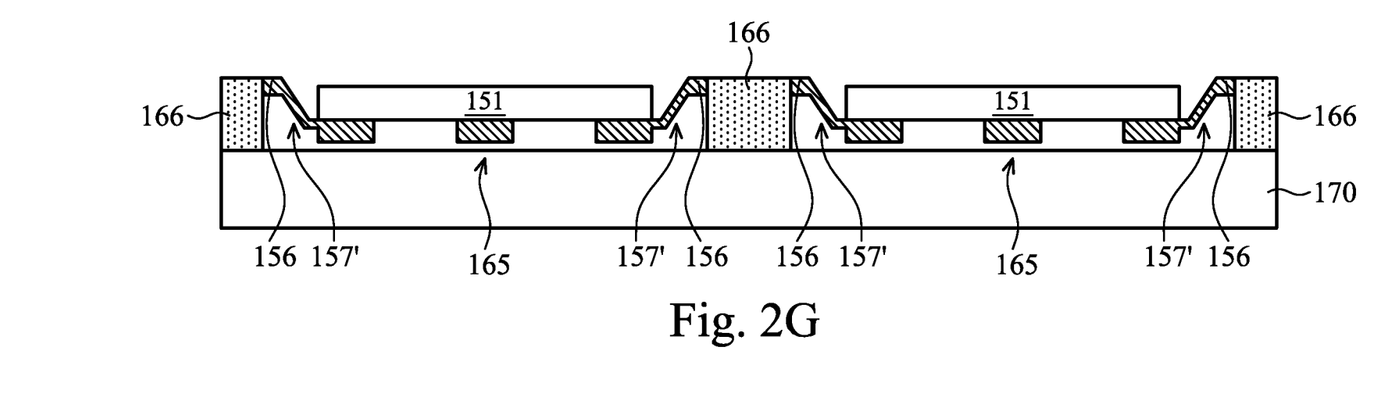

A molding compound 166 is then formed on carrier 170 to fill the space between dies 165. The formation process of molding compound 166 involves applying a molding compound material followed by an annealing process, in accordance with some embodiments. Backside surface of substrate 150 then undergoes a thinning process, such as grinding, to expose copper layer 156 in TsVs 157' of substrate 150, as shown in FIG. 2G in accordance with some embodiments.

Figure 2H:
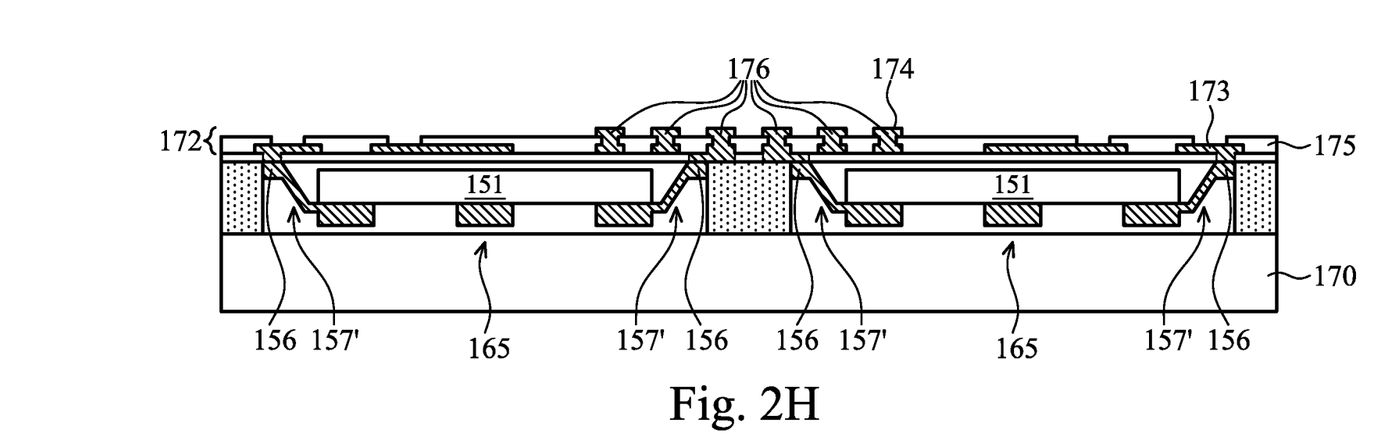

After copper layer 156 is exposed, a passivation layer 171 is formed over the backside surface with the exposed copper layer 156, as shown in FIG. 2H in accordance with some embodiments. In some embodiments, the passivation layer 171 is made of SiN and is formed by a low-temperature chemical vapor deposition (LTCVD) process. In some embodiments, the deposition temperature of the LTCVD process is in a range from about 160° C. to about 250° C. Passivation layer 171 is patterned to form openings for subsequently formed RDLs, as described below.

Fan-out redistribution structures 172 are then formed over passivation layer 171. FIG. 2H shows that redistribution structures 172 extend beyond the boundaries of dies 165 to expand the connectivity; therefore, redistribution structures 172 are described as fan-out redistribution structures 172. The redistribution structures 172 include one or more redistribution layers (RDLs), which may also be called post passivation interconnect (PPI). FIG. 2H shows two redistribution layers 173 and 174, which are separated by a passivation layer 175. The redistribution layers 173 and 174 are made of conductive materials, such as copper, copper alloy, or other applicable materials. To form the redistribution layer 173, a barrier-seed layer (not shown) is formed prior to the formation of the redistribution layer 173, in some embodiments. The passivation layer 175 is made of a polymer, such as polyimide, polybenzoxazole (PBO), or benzocyclobutene (BCB). FIG. 2H shows that redistribution layer 173 contacts the exposed copper layer 156 in the TsVs 157'. In the embodiment shown in FIG. 2H, the redistribution layer 174 include copper posts 176. In some embodiments, a solder layer (not shown) is formed over copper posts 176.

In some embodiments, a under bump metallurgy (UBM) layer (not shown) is formed between the interface between RDL 173 and redistribution layer 174, which includes copper posts 176. The UBM layer also lines the sidewalls of openings of passivation layer 175 used to form copper posts 215. Examples of redistribution structures and bonding structures, and methods of forming them are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

Figure 2I:
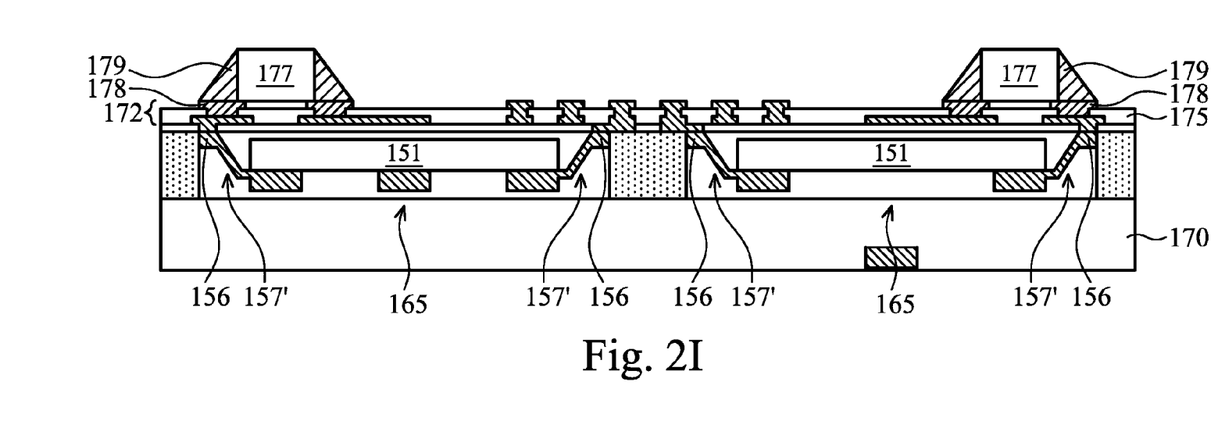

After the redistribution structures 172 are formed, dies and/or components are bonded to the redistribution structure 172. In some embodiments, passive electronic components 177, such as resistors or capacitors, are bonded to redistribution layer 173 of redistribution structure 172, as shown in FIG. 2I in accordance with some embodiments. A solder paste 178 and solder layer 179 are used to bond to passive electronic components 177 by reflow. Although passive electric components 177 are described here, active electric components (semiconductor dies) are used in some embodiments.

Figure 2J:
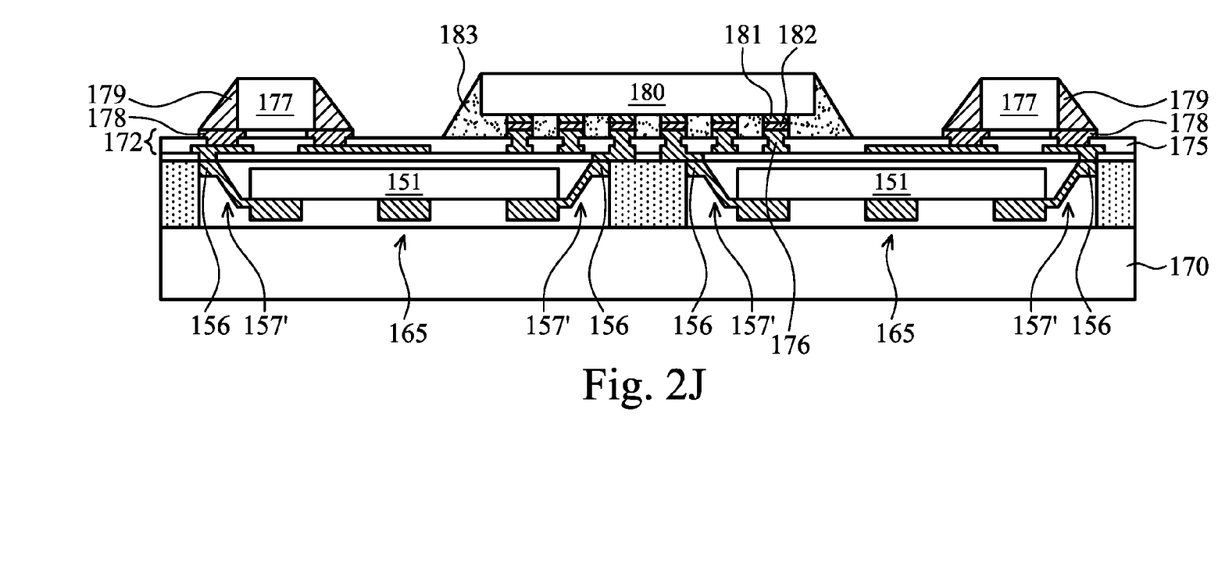

Following the bonding of passive electronic components 177 to redistribution structure 172, a semiconductor die 180 is bonded to redistribution structure 172, as shown in FIG. 2J in accordance with some embodiments. Bump structures 181 of semiconductor die 180 are bonded to copper posts 176 of redistribution structure 172 to form bonding structures 182. As mentioned above, a solder layer could exist over copper posts 176. Afterwards, an underfill 183 is applied between die 180 and redistribution structure 172, as shown in FIG. 2J in accordance with some embodiments. An annealing process could be involved to complete the formation of underfill 183. Underfill 183 supports die 180 and protects bonding structure 182.

Figures 2K, 2L:
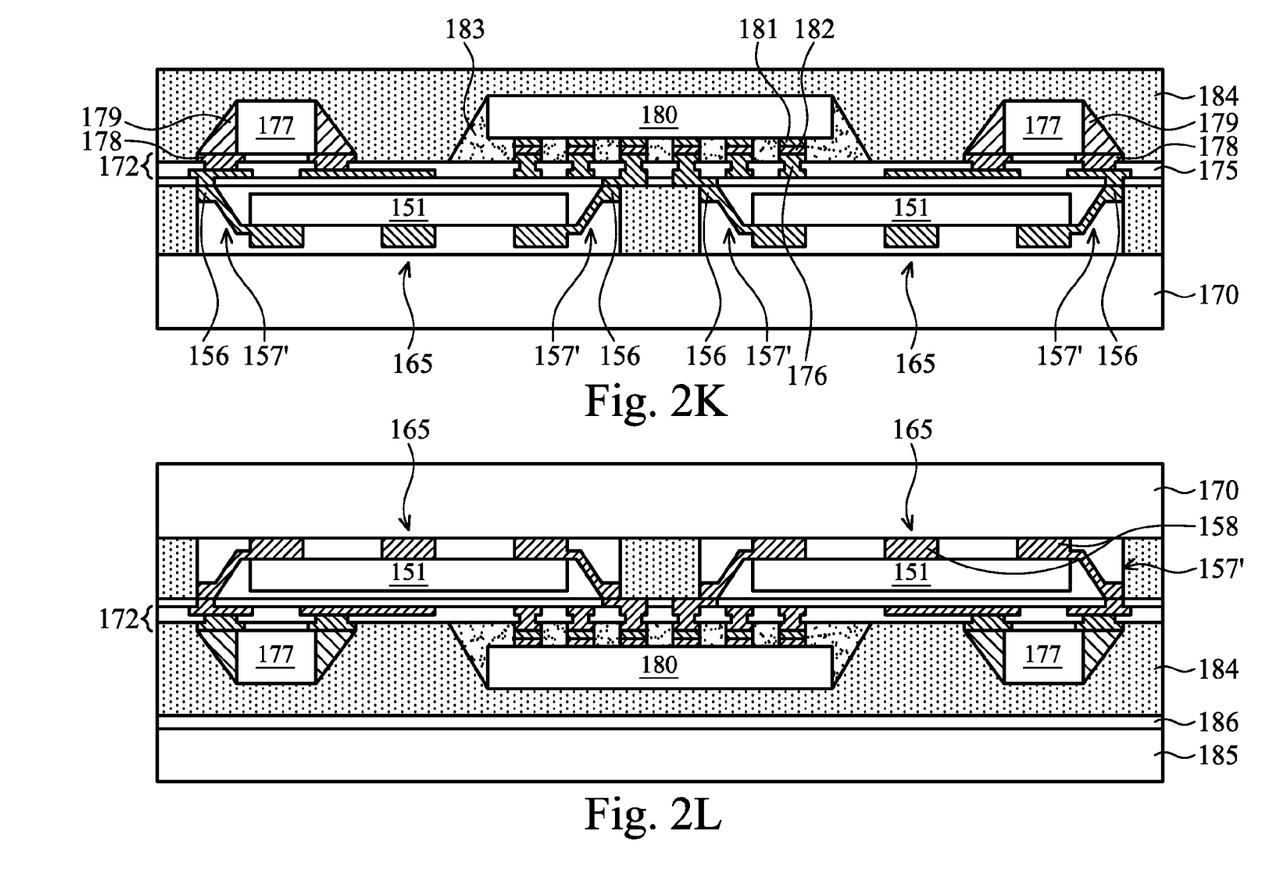

After the underfill 183 is formed, a molding compound 184 is formed over die 180, components 177 and exposed surface of redistribution structure 172, as shown in FIG. 2K in accordance with some embodiments. The formation process of molding compound 184 involves applying a molding compound material followed by an annealing process, in accordance with some embodiments. The carrier 170 of FIG. 2K is then turned upside down for surface with molding compound 184 to be glue to a carrier 185 by an adhesive layer 186, as shown in FIG. 2L in accordance with some embodiments. Carrier 185 may be made of various materials that can provide support for the structure glued to it and the packaging processes following. In some embodiments, carrier 185 is made of glass. However, other materials, such as stainless steel, may also be used.

Figure 2M:
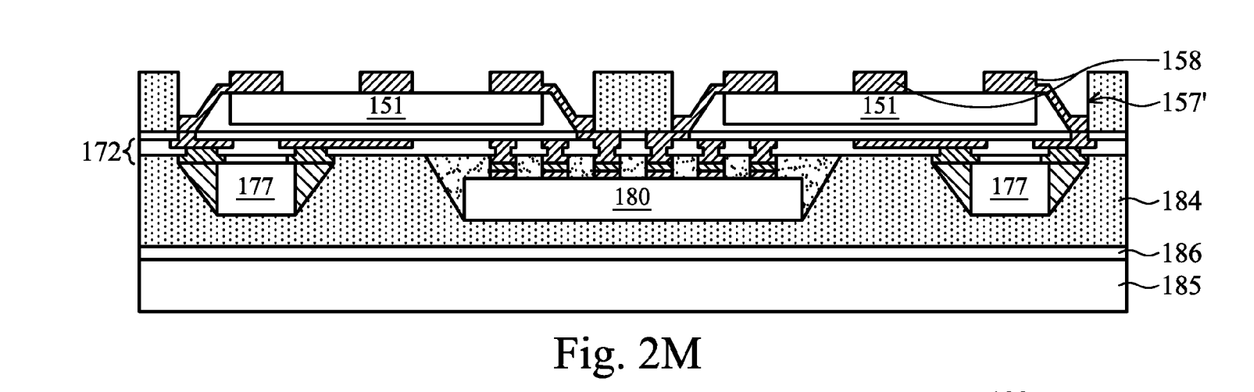
Figure 2N:
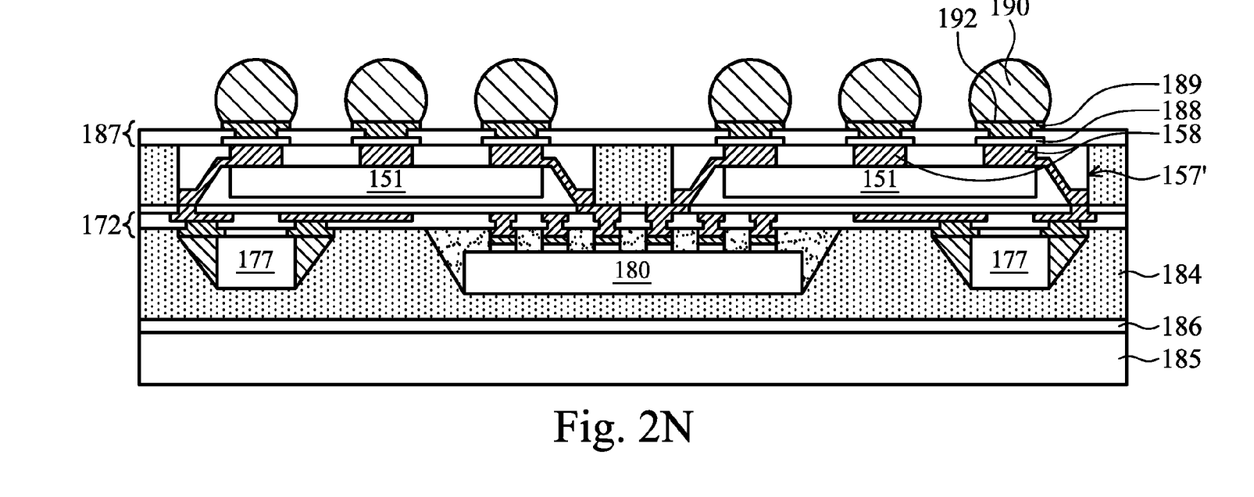

Afterwards, carrier 170 is removed from the structure of FIG. 2L. A thinning process, such as grinding, is performed to remove portions of NCF 159 and molding compound 166 to expose copper posts 158, as shown in FIG. 2M in accordance with some embodiments. Fan-out redistribution structures 187 are then formed over passivation layer exposed copper posts 158 and surrounding NCF 159, as shown in FIG. 2N in accordance with some embodiments, in accordance with some embodiments. Redistribution structures 187 extend beyond the boundaries of dies 165 to expand the connectivity. The redistribution structures 187 include one or more redistribution layers (RDLs), which may also be called post passivation interconnect (PPI). FIG. 2N shows two redistribution layers 188 and 189, which are separated by a passivation layer 191. The redistribution layers 188 and 189 are made of conductive materials, such as copper, copper alloy, or other applicable materials. To form the redistribution layer 188, a barrier-seed layer (not shown) is formed prior to the formation of the redistribution layer 188, in some embodiments. The passivation layer 191 is made of a polymer, such as polyimide, polybenzoxazole (PBO), or benzocyclobutene (BCB). FIG. 2O shows that redistribution layer 188 contacts the exposed copper posts 158. In the embodiment shown in FIG. 2N, the redistribution layer 189 includes contact pads 192. Solder balls 190 are formed over contact pad 192, as also shown in FIG. 2N in accordance with some embodiments. In some embodiments, solder balls 190 are for ball grid array (BGA).

After solder balls 190 are formed over redistribution structure 187, device package 195 are singulated, such as by sawing, into individual packages. The adhesive layer 186 and the carrier 185 are then removed. FIG. 2O shows a device package 195, in accordance with some embodiments.

Figure 3:
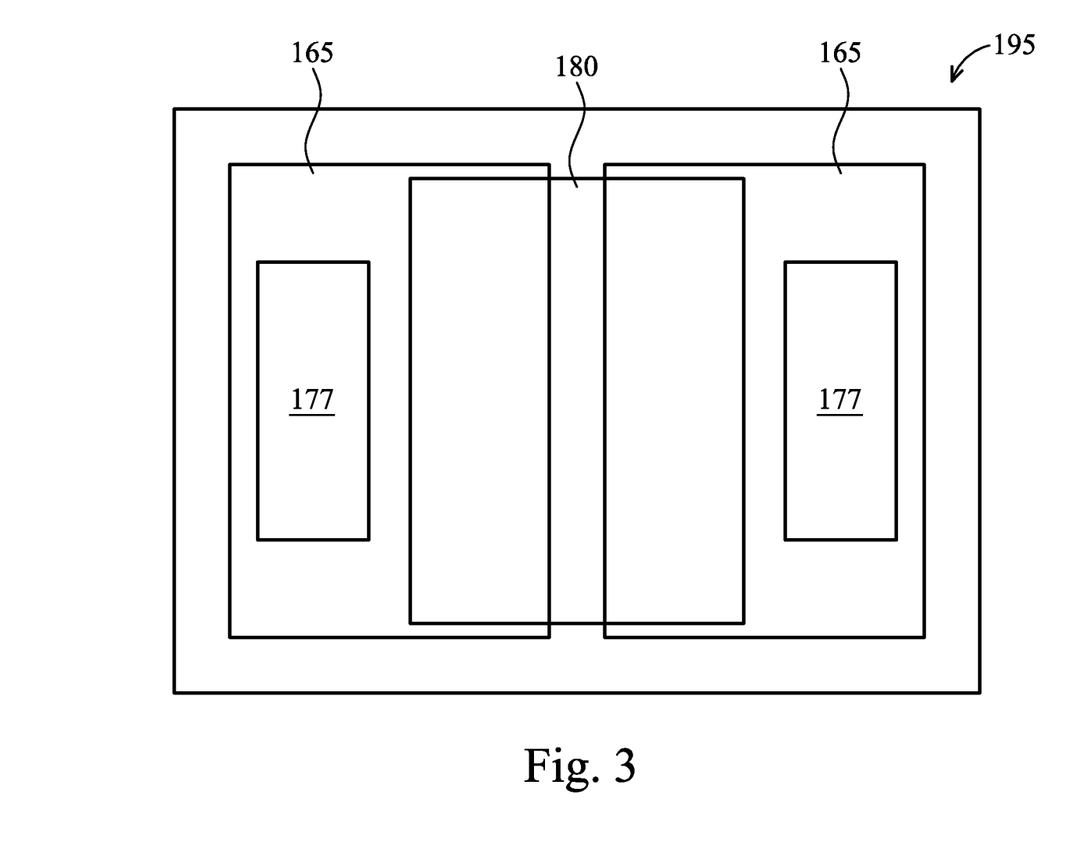
FIG. 3 shows a top view of a device package, in accordance with some embodiments.

FIG. 3 shows a top view of device (or die) package 195, in accordance with some embodiments. Device package 195 includes a die 180 and two components 177 over two dies 165. As described above, the copper layer 156 in TsVs 157' (not shown in FIG. 3) are used to form electrical connections between die 180 and components 177 in upper level to dies 165 in lower level of package 195. The components used device package 195 described above are merely examples. Different number of dies can be placed at the levels of dies 165 and 180. Active and passive components can be mixed and matched to achieve different purposes and performance of device package. For example, the device package 195 described above includes two identical dies 165, the two dies under die 180 could be different dies with different devices. In addition, the upper die, such as die 180, could be more than one. Further, one or both of passive electronic components could be replaced with semiconductor die(s) with active devices.

The various combinations of upper and lower dies and components are bonded together using TsVs (or halved TSVs) to provide electrical connections between dies. Since the TsVs are located at the edges of the lower dies, they do not degrade the performance of the device regions in the dies. In addition, the RDLs in the redistribution structures formed on both sides of the lower dies enable fan-out and fan-in connections between lower dies and also between upper and lower dies.

Various embodiments of mechanisms for forming a die package using through sidewall vias (TsVs), which are formed by sawing through substrate via (TSV) in half, at edges of dies described enable various semiconductor dies and passive components be electrically connected to achieve targeted electrical performance. Redistribution structures with redistribution layers (RDLs) are used along with the TsVs to enable the electrical connections. Since the TsVs are away from the device regions, the device regions do not suffer from the stress caused by the TSV formation. In addition, electrical connections between upper and lower dies by the TsVs increases the efficiency of the area utilization of the die package.

In some embodiments, a semiconductor die package is provided. The semiconductor die package includes a first semiconductor die with a first device region and a first through sidewall via (TsV) formed therein. The first TsV is separated from the device region, and the first TsV is disposed at an edge of the first semiconductor die. The semiconductor die package also includes a first conductive structure formed over the first semiconductor die. The first conductive structure is electrically connected to devices in the first device region and physically contacts a first end of the first TsV of the first semiconductor die. The semiconductor die package further includes a second conductive structure formed over a surface on the opposite side of the first semiconductor die from the first conductive structure. The second conductive structure contacts a second end of the first TsV of the first semiconductor die.

In some embodiments, a semiconductor die package is provided. The semiconductor die package includes a first semiconductor die with a first device region and a first through sidewall via (TsV) formed therein, and the first TsV is separated from the device region. The first TsV is disposed at an edge of the first semiconductor die. The semiconductor die package also includes a first conductive structure formed over the first semiconductor die. The first conductive structure is electrically connected to devices in the first device region and physically contacts a first end of the first TsV of the first semiconductor die. The semiconductor die package further includes a second conductive structure formed over a surface on the opposite side of the first semiconductor die from the first conductive structure. The second conductive structure contacts a second end of the first TsV of the first semiconductor die. The semiconductor die package additionally includes a second semiconductor die with a second device region and a second through sidewall via (TsV) formed therein. The second TsV is separated from the device region, and wherein the second TsV is disposed at an edge of the second semiconductor die.

In yet some other embodiments, a method of forming a semiconductor die package is provided. The method includes forming a through silicon via (TSV) near an edge and away from a device region of a semiconductor die of a semiconductor substrate. A conductive material in the TSV extends to form a conductive structure over the device region. The method also includes sawing the semiconductor die to separate the semiconductor die from the rest of the semiconductor substrate, wherein the sawing is applied through the TSV. The method further includes forming a first redistribution structure connected to the conductor structure, and forming a second redistribution structure electrically connected to the TSV.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor die package, comprising:
    a first semiconductor die with a first device region, a first major surface, a second major surface, and a sidewall surface connecting the first major surface and the second major surface, and a first through sidewall via (TsV) formed therein, wherein the first TsV is separated from the device region, and wherein the first TsV has a first end at the first major surface of the first semiconductor die that is laterally displaced from the sidewall surface of the first semiconductor die and has a second end at the second major surface of the first semiconductor die that is laterally immediately adjacent the sidewall surface of the first semiconductor die;
    a first conductive structure formed over the first semiconductor die, wherein the first conductive structure is electrically connected to devices in the first device region and physically contacts the first end of the first TsV of the first semiconductor die; and
    a second conductive structure formed over a surface on the opposite side of the first semiconductor die from the first conductive structure, wherein the second conductive structure contacts the second end of the first TsV of the first semiconductor die.

2. The semiconductor die package of claim 1, wherein, the first TsV is partially filled with a conductive material.

3. The semiconductor die package of claim 1, wherein the first conductive structure and the first TsV both include a conductive material.

4. The semiconductor die package of claim 3, wherein a first height of the conductive material of the first conductive structure is taller than a second height of the conductive material of the first TsV.

5. The semiconductor die package of claim 4, wherein the first height is in a range from about 10 μm to about 40 μm.

6. The semiconductor die package of claim 4, wherein the second height is in a range from about 0.35 μm to about 40 μm.

7. The semiconductor die package of claim 1, wherein the depth of the first TsV is in a range from about 30 μm to about 250 μm.

8. The semiconductor die package of claim 1, further comprising:
    a second semiconductor die with a second device region and a second through sidewall via (TsV) formed therein, wherein the second TsV is separated from the device region, and wherein the second TsV has a third end at a third major surface of the second semiconductor die that is laterally displaced from a second sidewall surface of the second semiconductor die and has a fourth end at a fourth major surface of the second semiconductor die that is laterally immediately adjacent the second sidewall surface of the second semiconductor die.

9. The semiconductor die package of claim 8, further comprising:
    a third conductive structure formed over the third major surface of the second semiconductor die, wherein the third conductive structure is electrically connected to devices in the second device region and physically contacts the third end of the second TsV of the second semiconductor die; and
    a fourth conductive structure formed over the fourth major surface of the second semiconductor die, wherein the fourth conductive structure contacts the fourth end of the second TsV of the second semiconductor die.

10. The semiconductor die package of claim 9, wherein a first redistribution structure is formed over the first conductive structure of the first semiconductor die and the third conductive structure of the second semiconductor die.

11. The semiconductor die package of claim 9, further comprising:
a third semiconductor die, wherein the third semiconductor die is electrically connected to the second conductive structure of the first semiconductor die.

12. The semiconductor die package of claim 9, wherein a second redistribution structure is formed over the second conductive structure of the first semiconductor die and the fourth conductive structure of the second semiconductor die.

13. The semiconductor die package of claim 12, further comprising:
a third semiconductor die, wherein the third semiconductor die is coupled to the first semiconductor die and the second semiconductor die through the second redistribution structure.

14. The semiconductor die package of claim 9, further comprising:
a passive electronic component electrically connected to the first TsV.

15. A semiconductor die package, comprising:
a first semiconductor die with a first device region and a first through sidewall via (TsV) formed therein, wherein the first TsV is separated from the device region, and wherein the first TsV is disposed at an edge of the first semiconductor die and has a first end that overlaps the device region and a second end opposite the first end that is laterally displaced from the device region, and that is laterally immediately adjacent a sidewall of the first semiconductor die;
a first conductive structure formed over the first semiconductor die, wherein the first conductive structure is electrically connected to devices in the first device region and physically contacts the first end of the first TsV of the first semiconductor die;
a second conductive structure formed over a surface on the opposite side of the first semiconductor die from the first conductive structure, wherein the second conductive structure contacts the second end of the first TsV of the first semiconductor die; and
a second semiconductor die with a second device region and a second through sidewall via (TsV) formed therein, wherein the second TsV is separated from the device region, and wherein the second TsV is disposed at an edge of the second semiconductor die.

16. The semiconductor die package of claim 15, wherein a first redistribution structure is formed over the first conductive structure of the first semiconductor die and a third conductive structure of the second semiconductor die.

17. The semiconductor die package of claim 15, wherein a second redistribution structure is formed over the second conductive structure of the first semiconductor die and a fourth conductive structure of the second semiconductor die.

18. A semiconductor die package, comprising:
a first semiconductor die with a first device region and a first through sidewall via (TsV) formed therein, wherein the first TsV is separated from the device region, and wherein the first TsV is disposed at an edge of the first semiconductor die;
a first conductive structure formed over the first semiconductor die, wherein the first conductive structure is electrically connected to devices in the first device region and physically contacts a first end of the first TsV of the first semiconductor die;
a second conductive structure formed over a surface on the opposite side of the first semiconductor die from the first conductive structure, wherein the second conductive structure contacts a second end of the first TsV of the first semiconductor die;
a second semiconductor die with a second device region and a second through sidewall via (TsV) formed therein, wherein the second TsV is separated from the device region, and wherein the second TsV is disposed at an edge of the second semiconductor die; and
a second redistribution structure over the second conductive structure of the first semiconductor die and a fourth conductive structure of the second semiconductor die.

19. The semiconductor die package of claim 18, wherein a first redistribution structure is formed over the first conductive structure of the first semiconductor die and a third conductive structure of the second semiconductor die.

20. The semiconductor die package of claim 18, wherein the first conductive structure has a greater thickness than the first end of the first TsV.

21. The semiconductor die package of claim 18, wherein the first end of the first TsV has a thickness about 0.35 μm to about 40 μm.

* * * * *